Figure 1:
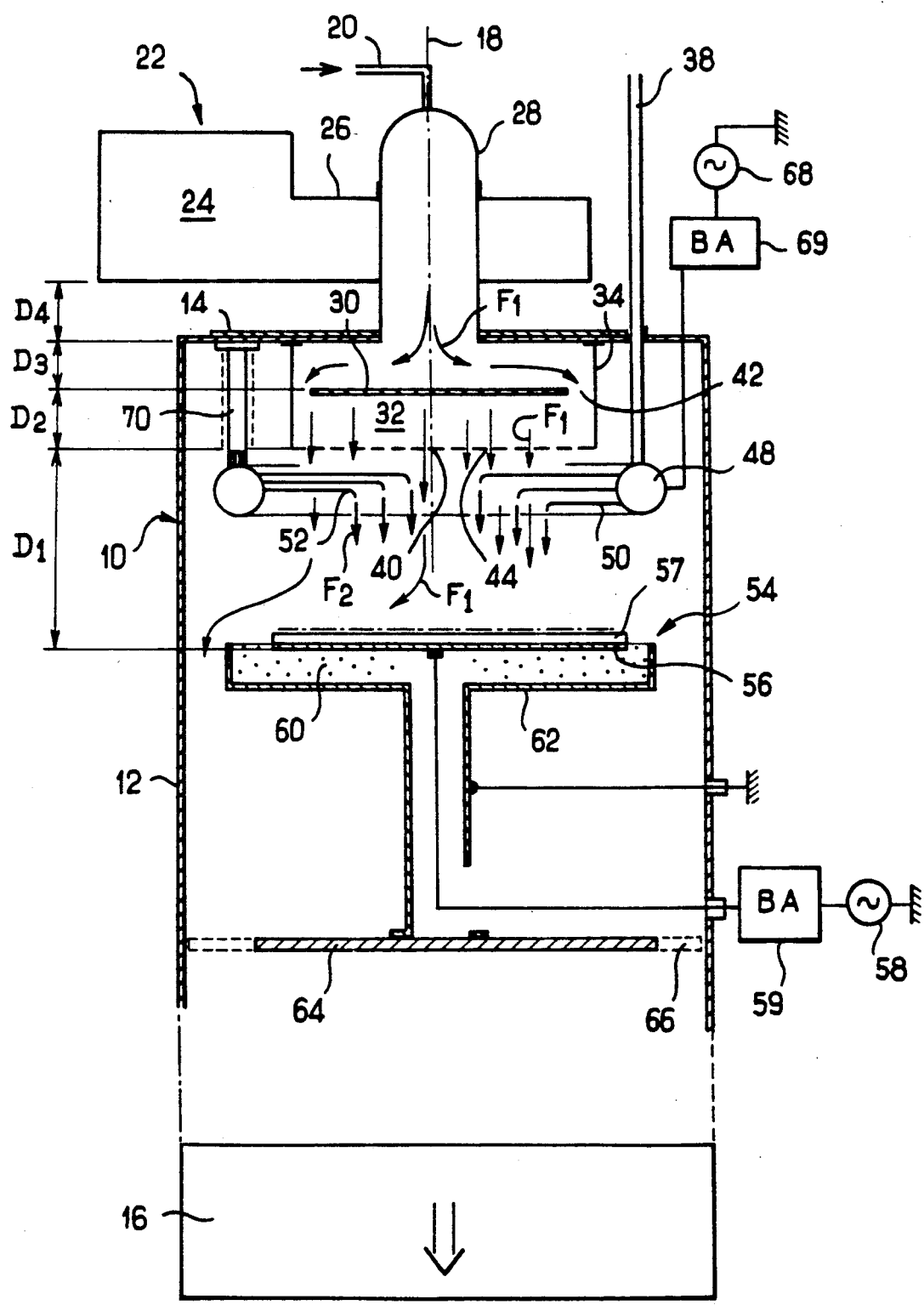

United States Patent [19]

Charlet et al.

[11] Patent Number: 5,105,761
[45] Date of Patent: Apr. 21, 1992

[54] DIFFUSION PLASMA-ASSISTED CHEMICAL TREATMENT APPARATUS

[75] Inventors: Barbara Charlet, Montbonnet; Louise Peccoud, Daix F; Thierry Sindzingre, Cachan, all of France

[73] Assignee: Commissariat a l'Energie Atomique, Paris, France

[21] Appl. No.: 597,812

[22] Filed: Oct. 15, 1990

[30] Foreign Application Priority Data

Oct. 19, 1989 [FR] France ............... 89 13685

[51] Int. Cl.⁵ .......................... H01L 21/00
[52] U.S. Cl. .................. 118/723; 118/733; 118/719; 156/345
[58] Field of Search ........... 118/723, 733, 719; 156/345

[56] References Cited

U.S. PATENT DOCUMENTS

| | | | |
|---|---|---|---|
| 4,401,054 | 8/1983 | Matsuo et al. | 118/723 |
| 4,659,449 | 4/1987 | Watanabe | 156/345 |
| 4,944,244 | 7/1990 | Moisan et al. | 118/723 |
| 4,998,503 | 3/1991 | Murakami et al. | 118/723 |

FOREIGN PATENT DOCUMENTS

| | | |
|---|---|---|
| 0090586 | 10/1983 | European Pat. Off. . |
| 0237078 | 9/1987 | European Pat. Off. . |
| 87-07310 | 12/1987 | World Int. Prop. O. . |

OTHER PUBLICATIONS

Microelectronic Engineering 3 (1985) 397–410.

*Primary Examiner*—David A. Simmons
*Assistant Examiner*—George A. Goudreau
*Attorney, Agent, or Firm*—Pearne, Gordon, McCoy & Granger

[57] ABSTRACT

The apparatus comprises a tight treatment enclosure (10), means (20,22) for the axial production of a carrier gas plasma, a solid plate (30) serving as an obstacle to the plasma and located perpendicular to the enclosure axis and downstream of the plasma production means, plasma diffusion means (40) located downstream of the obstacle plate, several non-ionized vector gas supply tubes (50) issuing axially into the enclosure beneath the diffusion means and all located in the same plane around the enclosure axis, a substrate carrier (56) positioned downstream of the vector gas supply tubes and perpendicular to the axis and annular pumping means (66,16) for the gaseous medium contained in the enclosure and positioned downstream of the substrate carrier.

12 Claims, 4 Drawing Sheets

DIFFUSION PLASMA-ASSISTED CHEMICAL TREATMENT APPARATUS

DESCRIPTION

The invention relates to an apparatus for chemical treatment assisted by a diffusion plasma and more particularly a vapour phase chemical etching and deposition apparatus assisted by a diffusion plasma. It more particularly applies in the microelectronics field to the production of integrated circuits and semiconductor lasers and to the field of integrated optics.

It is known in the plasma-assisted chemical deposition field to use a vacuum enclosure containing a receptor or receiver or support serving to support one or more substrates at the same time. A gaseous mixture inter alia containing the gaseous forms of the atoms which it is wished to deposit on the substrate is introduced in the vicinity of the receiver. The gaseous flow determined by the shape and size of the enclosure and the receiver is generally made to flow parallel to the substrates. As a result of an interaction between the plasma and the substrate, maintained at an adequate temperature, the desired coating is deposited and adheres to the surface of the substrate.

The use of a plasma makes it possible to lower the temperature of the deposits to below 600° C., which is obligatory for certain deposits in microelectronics.

This deposition procedure has hitherto been satisfactory, but due to the ever increasing size of the substrates to be treated and the ever more advanced quality requirements concerning the said deposits, the limits to said procedure have already been reached.

The problem to be solved is that of the gaseous flow for vapour phase chemical deposits, associated with the constraints linked with the use of a plasma.

In particular, it is necessary to prevent any reduction in the reagents on the path of the surfaces covered in order to prevent a non-uniform growth of the deposited coatings. It is also necessary to limit the contamination of the substrates. Thus, the vacuum enclosure walls become covered with undesirable deposits, which then become sources of particles which can be incorporated in the material during deposition. The plasma used for the assistance can be localized on the basis of a planar or diffusion-type plasma.

Compared with localized plasmas, diffusion plasmas have the advantage of separating the plasma creation area from the use area of the ionized species. It is therefore possible to ensure the control of the bombardment energy of the ionic species on the substrate and reduce the defects induced by the plasma in the deposits. Moreover, it is possible to reduce the heating of the substrate.

In order to obtain a good quality deposit and in order to better localize said deposit on the substrate, it is often preferable to use two gases, whereof at least one is reactive and to only ionize one of these gases. It is imperative to homogeneously mix these gases which will be in contact with the substrates to be treated.

The known single plate deposition apparatuses lead to two essential problems which must be simultaneously solved, namely the deposition speed and its uniformity. In addition, the insertion of these deposition machines into production lines can only take place if they are compatible with the production rates.

The uniformity of the deposits over the entire substrate surface is necessary in order to obtain materials satisfying the required quality characteristics. This uniformity is controlled by the volume diffusion of one gas into the other and by the diffusion to the substrate surface of the reactive species, said surface diffusions being dependent on the substrate temperature. However, in certain cases, said temperature must not be too high (<600° C.). Moreover, the uniformity of the deposits is encountered in the volume uniformization of the gas mixture.

It is easy to obtain deposit uniformity when working at very low pressures (<0.13 Pa) and therefore low chemical species concentrations. Under these conditions the deposition rate is a function of the pumping capacity of the vacuum enclosure. The flow rate of the pumped gas must be high in order to have high deposition rates.

At high pressure (>130 Pa), the concentrations of the reactive species are high and lead to high deposition rates (>5 μm/min). However, this favours a reaction between the gases present (nucleation), which is prejudicial for the homogeneity and adhesion of the deposit, because the latter takes place in powder form. It is also difficult to obtain deposit uniformity, because of the small volume diffusion.

At medium pressures, the obtaining of a high deposition rate is a function of the pumping of the gaseous medium of the enclosure and a high dissociation of said gaseous medium. The deposit uniformity is intermediate between that of the two aforementioned cases.

Usually one of the gases is used as the carrier gas. Consequently its flow rate is much higher than the others, which makes it very difficult to bring about homogeneity of the gaseous medium in the medium pressure range with gas flow rates of a few m/s. Therefore the uniformity of the deposits and their speed pass via the volume uniformization of the reactive gas and the carrier gas.

A diffusion plasma-assisted chemical vapour phase deposition apparatus (CVD) is described in the article by M. M. Moslehi, IEEE Electron Device Letters, vol. EDL.8, No. 9, September 1987, pp.421-424 "Formation of MOS gates by rapid thermal/microwave remote-plasma multiprocessing".

In this apparatus the reactive gas is not ionized and is introduced parallel to the substrate. In addition, the deposition enclosure is pumped parallel to the substrate.

The gas flow parallel to the substrate and the distribution of the ionized carrier gas in said deposition apparatus are unable to lead to a homogeneous deposit. In addition, there is no system therein for bringing about volume uniformity of the enclosure gaseous medium.

Another diffusion plasma-assisted CVD apparatus is described in the article by G. Lucovsky and D. V. Tsu, Journal of Non-crystalline Solids, 90, 1987, pp. 259-266 "Deposition of silicon oxide, nitride and oxynitride thin films by remote plasma enhanced chemical vapor deposition".

In this apparatus, the reactive gas is diffused on the periphery of the deposition enclosure by a diffusion ring leading to inhomogeneities in the deposit. This apparatus can only be used for small substrate. In addition, the plasma therein is only slightly dissociated as a result of the use of radio frequencies.

FR-A-2 588 275 provides a CVD apparatus having a diffuser for the reactive gases arranged so as to make the deposits uniform. To this end, said diffuser is constituted by a perforated plate positioned above the substrate and parallel thereto. Moreover, said plate is oriented perpendicular to the enclosure axis.

Unfortunately this device cannot be used for assistance by diffusion plasma. Thus, said apparatus has baffles level with the diffuser, whose shape would lead to a deexcitation of the plasma and therefore to the obtaining of a neutral gas no longer able to act with the reactive gas.

The invention relates to a diffusion plasma-assisted vapour phase chemical deposition apparatus leading to homogeneous deposits on large substrates.

Furthermore, in dry chemical etching processes, use is often made of assistance by a plasma in order to obtain anisotropic etching leading to abrupt profiles and planar, smooth etching bases.

The anisotropy and homogeneity of etching on large substrates are also dependent on the volume uniformization of the gas mixture and the problems referred to hereinbefore for CVD deposits also apply to plasma-assisted chemical etching.

Thus, the essential difference between CVD deposits and dry chemical etching is the nature of the reactive gases. Moreover, a CVD apparatus can also be used for dry chemical etching.

The invention therefore relates to a diffusion plasma-assisted chemical treatment apparatus making it possible to obviate the aforementioned disadvantages. This apparatus more particularly ensures homogeneous deposits and etching for large substrates (diameter greater than 3 cm and even 15 cm) with speeds compatible with the production rates. Moreover, there is only very slight contamination of the deposits made.

This apparatus also makes it possible to control the ionic bombardment energy for the substrates, consequently leading to a reduction in the defects induced by the plasma in the deposits and etched materials.

Finally, said apparatus can be of the monosubstrate or multisubstrate type.

The gas homogenization means used in the treatment apparatus according to the invention have resulted from a series of experiments performed by the Inventors. These experiments have revealed that the non-ionized reactive gas must have a delocalized distribution in the ionized carrier gas, a punctiform distribution or a peripheral distribution of the non-ionized gas always leading to non-uniform deposits. Punctiform distribution leads to a deposit with a gaussian shape and peripheral distribution to a deposit having two successive gaussian shapes, the maxima thereof facing the injector of the non-ionized gas into the enclosure.

More specifically, the present invention relates to a diffusion plasma-assisted chemical treatment apparatus incorporating a tight treatment enclosure having an axis of symmetry, axial production means for a plasma of a carrier gas in the enclosure, at least one solid plate serving as an obstacle to the plasma and positioned perpendicular to the axis and downstream of the production means, plasma diffusion means located downstream of the plate in the enclosure, several non-ionized vector gas supply tubes issuing axially into the enclosure, beneath the diffusion means, the ends of said tubes issuing into the enclosure being in the same plane around the enclosure axis, at least one substrate carrier located in the enclosure downstream of the supply tubes and perpendicular to the enclosure axis and annular, axial pumping means for the gaseous medium contained in the enclosure and positioned downstream of the substrate carrier.

The carrier gas and the vector gas can be respectively constituted by a single gas or a gaseous mixture, the composition of said gases being a function of the deposition or etching type envisaged.

Moreover, the carrier gas can be an inert gas not participating in the deposition or etching, or can be a reactive gas. For example, for a silicon deposit, the carrier gas is hydrogen and the vector gas a silane or a disilane such as $SiH_4$, $SiH_2Cl_2$, $Si_2H_6$, and for a $SiO_2$ deposit the carrier gas is $N_2O$ and the vector gas is a silane.

The apparatus according to the invention permits a gas distribution spatially limiting the formation of the deposits or etchings to the mixture zone of the gases.

As a result of the apparatus according to the invention, the distribution of the non-ionized vector gas in the flow of the ionized carrier gas ensures a uniform partial pressure field for the same, thus limiting local risks of homogeneous phase nucleation. Thus, the particle pollution risks of deposits or etchings are reduced. Moreover, the performance characteristics of the reactive gases are increased and high deposition and etching speeds can be obtained (e.g. 5 $\mu$m/min) using high pumping and reactive gas rates (gas rate approximately 500 scc/min and pumping rate approximately 10000 l/min).

In the case of a deposit, its stoichiometry is controlled by the composition of the gaseous mixture and is adjusted by the relative values of the gaseous flow rates.

Preferably, the apparatus also comprises a buffer chamber sealed by a perforated plate constituting the plasma diffusion means, said chamber communicating with the plasma production means, the obstacle plate contained in said chamber defining with the latter a peripheral space for the plasma flow. This permits a separation of the plasma creation area from the substrate and thus ensures that the plasma production means are not bound by the substrate size. Thus, the apparatus according to the invention makes it possible to treat large diameter substrates of 15 to 20 cm (6 or 8 inch).

According to a preferred embodiment of the invention, the apparatus also comprises a peripheral buffer chamber surrounding the enclosure axis and communicating with the gas vector supply tubes and the vector gas supply means for said buffer chamber.

Advantageously, said tubes are made from an electricity conducting material and are polarized with the aid of a radio frequency or low frequency voltage. This system makes it possible to obtain local plasmas generating active species of different natures, which react with those from the upper plasma production means. Moreover, this makes it possible to avoid deposits on the gas supply tubes and consequently a dirtying thereof.

Advantageously, a low frequency or radio frequency polarization can be maintained on the substrate carrier in order to ensure the energy control of the incident ions and consequently the stoichiometry of the deposit, its constraints and its density and in the case of etching its anisotropy and selectivity.

The invention is described in greater detail hereinafter relative to non-limitative embodiments and the attached drawings, wherein show:

FIG. 1 diagrammatically the principle of the treatment apparatus according to the invention.

Figure 2:
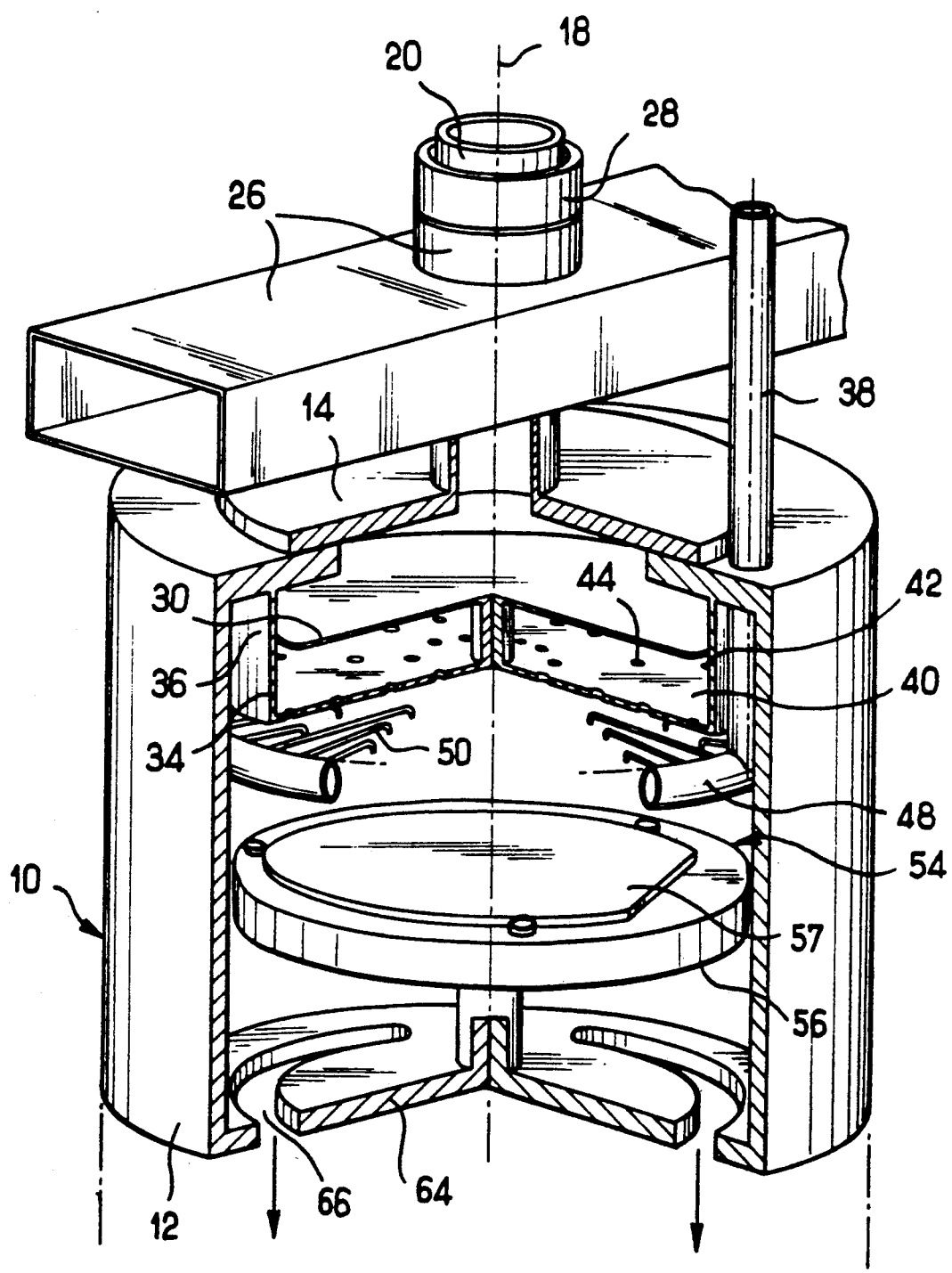

FIG. 2 a perspective view of an embodiment of the apparatus according to the invention.

Figure 3:
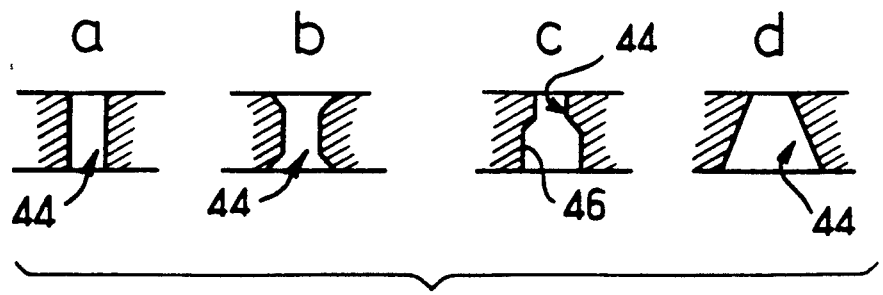

FIG. 3 different machining forms of perforations of the ionized carrier gas diffuser of the apparatus of FIG. 2.

Figure 4:
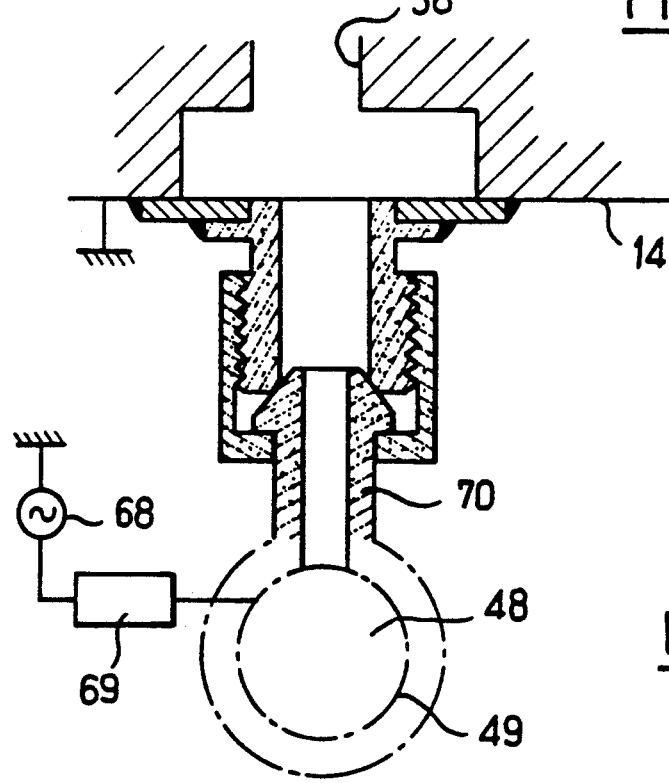

FIG. 4 diagrammatically a larger-scale part of FIG. 2 at the buffer chamber ensuring the vector gas supply.

Figure 5:
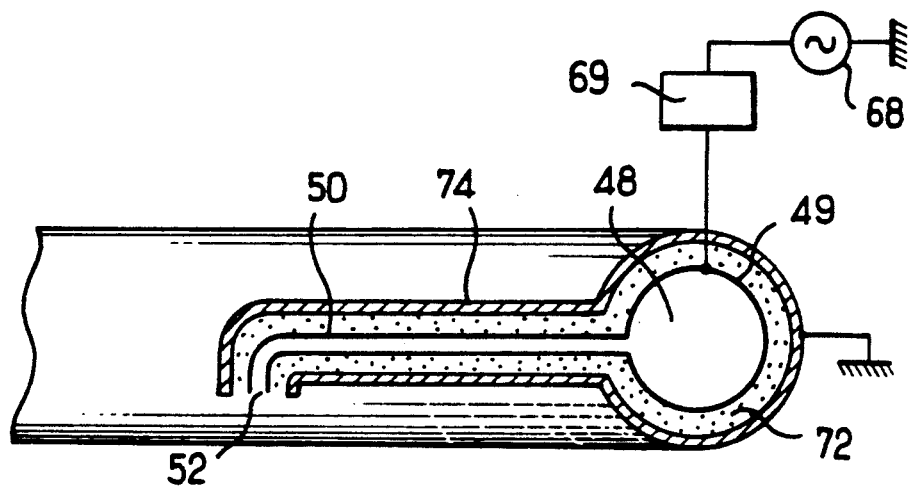

FIG. 5 diagrammatically an embodiment of the vector gas supply tubes of the apparatus according to the invention.

Figure 6A:
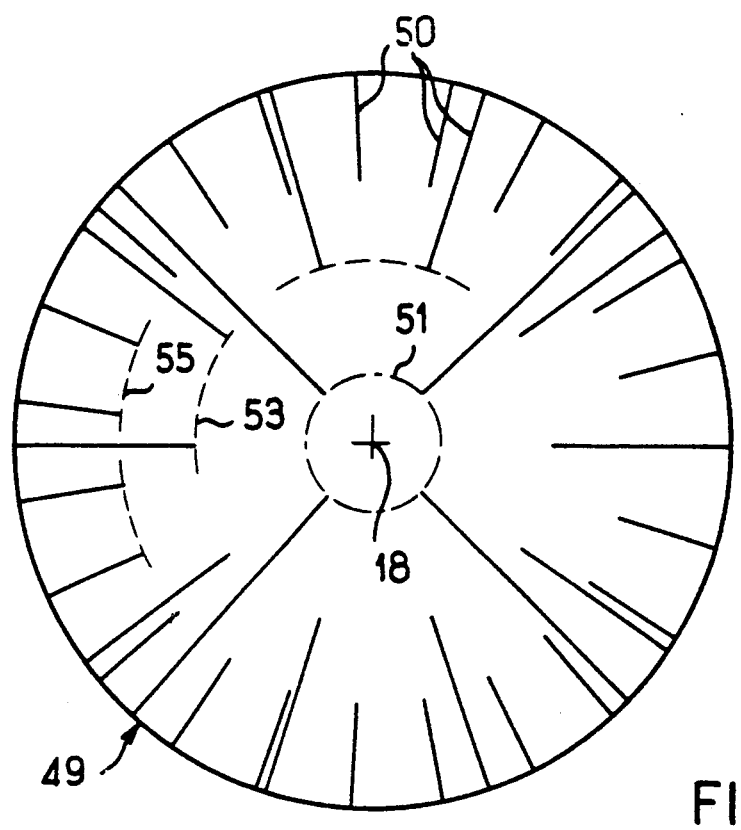
Figure 6B:
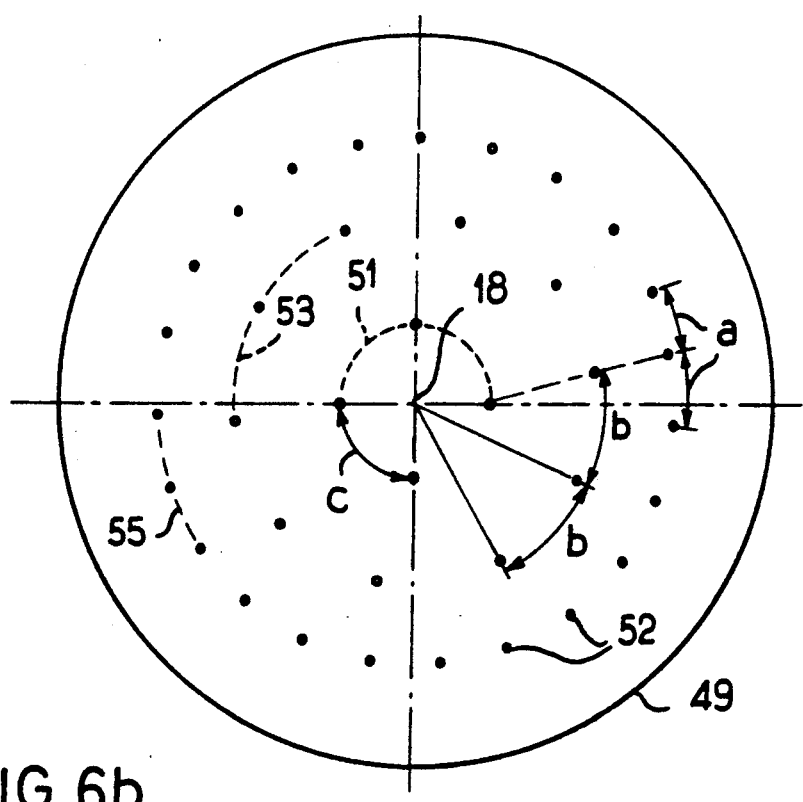

FIGS. 6A and 6B diagrammatically and respectively a view from above and from below illustrating the distribution of the ends of the supply tubes.

The following description relates to a monosubstrate treatment enclosure. The modifications to be made thereto in order to form a multisubstrate apparatus fall within the routine activity of the Expert.

On referring to FIGS. 1 and 2, the treatment apparatus according to the invention incorporates a tight treatment enclosure 10, constituted by a cylindrical envelope 12 sealed at its upper end by a cover 14, the other end of the envelope communicating with a pumping system 16. The axis of revolution of the treatment enclosure 10 carries the reference 18. On the enclosure cover 14 is mounted a carrier gas supply tube 20, whose revolution axis coincides with the enclosure axis 18. This axial tube 20 is coupled to a surfaguide excitation source 22.

This type of plasma source permits a high dissociation of the carrier gas. It comprises an ultra-high frequency wave generator 24 coupled by a rectangular waveguide 26 to a circular section cell 28, which is transparent to the ultra-high frequency waves and is arranged along the enclosure axis 18. This cell 28 is directly linked with the carrier gas supply tube 20.

The flows of the carrier gases from the ultra-high frequency cell 28, indicated by the arrows F1, are disturbed by a solid plate 30 shaped like a planar disk. This obstacle plate 30 is perpendicular to the axis 18 and is located in a cylindrical buffer chamber 32. The obstacle plate 30 more particularly separates the exciting structure of the plasma from the system for injecting said plasma into the enclosure 10.

The cylindrical envelope 34 defining the buffer chamber 32 is integral with the cover 14 of the treatment enclosure and its axis of revolution coincides with that of the enclosure. This cylindrical envelope 34 defines with the envelope 12 an annular space 36 for the passage of a non-ionized, vector gas, peripheral supply duct 38.

The lower end of the chamber 32 is sealed by a circular perforated plate 40 integral with the cylindrical envelope 34 and parallel to the obstacle plate 30. This perforated plate, which serves as an injector of the plasma into the enclosure 10, permits the diffusion of the plasma from the cell 28 and disturbed by the plate 30. An annular space 42 between the obstacle plate 30 and the cylindrical envelope 34 ensures the passage (F1) of the carrier gas plasma from the cell 28 to the diffusion plate 40.

The shape of the holes 44 of the diffusion plate 40 is adjusted as a function of the dimensions of the substrate to be treated and the same applies with respect to their number.

FIG. 3 shows different possible machining shapes for the holes 44. As shown, the holes 44 can have a cylindrical shape (part a of FIG. 3), a double cone shape (part b of FIG. 3), a conical shape (part d of FIG. 3) or a generally cylindrical shape with a widened section 46 on the outlet side of the diffused plasma (part c of FIG. 3). As for the holes in the diffusion plate 40, the dimensions of the obstacle plate 30 and the buffer chamber 32 are to be adapted to the dimensions of the substrates to be treated. The larger the substrates to be treated, the larger the volume of the chamber 32, the surface of the plate 30 and the number of holes 44 in the diffuser.

In order to ensure a good diffusion of the ionized carrier gas, the holes 44 can be distributed in accordance with concentric circles centered on the axis 18. These concentric circles are in particular distributed in a regularly spaced manner.

Downstream of the plasma diffuser 40, there is another toroidal buffer chamber 48 linked with the vector gas supply tube 38. This peripheral chamber 48 is defined by a toroidal envelope 49 centered on the axis 18.

This chamber 48 is linked with several vector gas supply tubes 50 issuing axially into the treatment enclosure 10. These tubes 50 are located radially in the same plane and parallel to the diffusion plate 40 and therefore perpendicular to the axis 18. The ends 52 of said tubes, issuing into the enclosure 10, are oriented towards a substrate carrier assembly 54. They are located in the same plane and in accordance with concentric circles centered on the axis 18 and as shown in FIGS. 6A and 6B respectively in views from above and below. FIGS. 6A and 6B show three concentric circles 51, 53 and 55.

The ends 52 of the same circle are equidistant of one another. The distances of the ends of the tubes disposed on the circles 51, 53 and 55 are respectively designated a, b, and c. Moreover, the ends of the tubes of a given concentric circle, e.g. 53 are staggered with respect to the ends of the tubes located on adjacent concentric circles 51 and 55.

These tubes 50 ensure a delocalized supply of the non-ionized vector gas, below the injection plane of the plasma diffused by the diffuser 40. The arrows F2 symbolize the vector gas flow.

Downstream of said tubes 50 is provided the substrate carrier assembly 54 having a planar part 56 or plate, in the form of a disk, arranged perpendicular to the enclosure axis 18 and centered on the latter. This planar part receives the substrate 57 to be treated.

Advantageously, the plate 56 of the substrate carrier assembly is partly or totally of metal and is connected to one of the terminals of a radio or low frequency generator 58 via a tuning box 59. The other terminal of the generator 58 is connected to earth or ground.

The metallic plate 56 is supported by an electrical and/or thermal insulant 60 mounted, in the case where the plate 56 is polarized, on a metal base 62 connected to earth or ground. This system permits a radio or low frequency polarization of the substrate 57 to be treated, positioned in contact with the metal plate 56. Moreover, the substrate 57 can be heated by not shown, conventional means. For this purpose, the plate 56 must be made from a good heat and electricity conducting material in the case where it is polarized and in particular from stainless material.

In order to avoid edge effects and ensure a homogeneous deposition over the entire substrate surface, it is desirable for the perforated plate 40 to have a diameter greater than that of the substrate carrier plate 56 (or the substrate carrier assembly when there are several of these).

The substrate carrier assembly base 52 is mounted on a circular plate 64 hermetically sealing the lower end of the treatment enclosure. This plate 64 has windows 66 distributed over a circle centered on the axis 18 and the plate 64 is perpendicular to the latter. These circular arc openings 66 ensure the linking of the treatment enclosure 12 with the pumping system 16 and permit an annular, peripheral pumping of the treatment enclosure in an axial direction.

The distance D1 separating the plate 56 of the substrate carrier and the plasma diffusion plate 40, the distance D2 separating the diffusion plate 40 from the obstacle plate 30, the distance D3 separating the latter from the enclosure cover 14 and the distance D4 separating the cover 14 from the ultra-high frequency guide 26 are to be experimentally adjusted as a function of the nature of the treatment to be carried out.

In the embodiment shown in FIG. 2 the cylindrical envelope 34, the obstacle plate 30 and the diffuser plate 40 are made from quartz or a stainless material. In conventional manner, the guide 26 is of metal, the cell 28 and gas supply duct 20 are e.g. of quartz and the duct 38 can be of stainless material.

If it is wished to polarize the vector gas supply tubes 50 with the aid of a low or radio frequency source 68 (FIG. 1), via a tuning box 69, it is necessary to use electrical insulating tubes 70, as shown in FIG. 4, in order to support the toroidal envelope 49 and thus insulate the enclosure 12 applied to the earth of the polarized tubes 50 (the envelope 49 and the tubes 50 being made from a conductive material, such as a stainless material). Apart from this electrical insulation, said tubes 70 link the vector gas supply tube 38 to the toroidal chamber.

The electrical insulant can be quartz or alumina. The low or radio frequency power from the source 68 is then supplied via a not shown, tight electric passage on the metal envelope 49 defining the toroidal buffer chamber. The other terminal of the source 68 is connected to earth or ground. Under these conditions, the entire vector gas injection system (wall 49 and tubes 50) is polarized.

As shown in FIG. 5, it is also possible to only ensure a polarization of the outlet end of the supply tubes 50. For this purpose, the envelope 49 and the supply tubes 50, which are made from a good conducting material such as a stainless material, with an insulating material 72, such as alumina or silica, which is covered with a conductive material 74 such as aluminium or silicon. This gives a coaxial structure, whose core (wall 49 and tubes 50) can be polarized. To this end, the low or radio frequency terminal of the source 68 is, via the tuning box 69, connected to the metal tubes 50 and to the envelope 49 of the toroidal chamber and their coating 74 is earthed.

It would have also been possible to connect to earth the tubes 50 and the envelope 49 and the coating 74 to the low or radio frequency terminal. In this case, the coating 74 is polarized.

The apparatus according to the invention has been used for the deposition of silicon oxide ($SiO_x$ with x being approximately 2) at high speed and in particular 1 μm/min in homogeneous manner on diameter 10 cm (4 inch) substrates.

The distances D1,D2,D3 and D4 are respectively 30,10,15 and 10 mm. There were 37 vector gas supply tubes, 23 of them issuing into the enclosure on a 100 mm diameter circle 55 centered on the axis 18, 10 of them issuing on a diameter 70 mm circle 53 centered on the axis 18 and 4 of them issuing onto a diameter 30 mm circle 51 centered on the axis 18. The internal diameter of the tubes was 1 mm.

The perforated plate 40 had a plurality of diameter 2 mm holes, 8 of them being located on a diameter 30 mm circle centered on the axis 18, 8 others on a 50 mm diameter circle centered on the axis, 16 others distributed according to a diameter 70 mm circle centered on the axis, 24 others distributed on a diameter 90 mm circle centered on the axis and 32 others distributed on a diameter 110 mm circle centered on the axis.

The internal diameter of the chamber 32 was 120 mm, the diameter of the obstacle plate 30 was 100 mm and the internal diameter of the deposition enclosure 12 was 248 mm.

$SiO_x$ deposition took place with a power supplied by the HF generator 24 of the plasma source of 400 W, a 0 W power reflected by said HF generator, with the ionized carrier gas $N_2O$ with a flow rate of 275 sccm (standard cubic centimetre per minute) $SiH_4$ at a flow rate of 70 sccm as the non-ionized vector gas, at a pressure of 14.6 Pa (110 mtorr) and a temperature of 400° C. controlled on the plate of the substrate carrier with the aid of a thermocouple.

Under these conditions, a good quality $SiO_2$ deposit was obtained, so-called microelectronics quality, with a good adherence and an average optical refractive index of 1.46. The uniformity of the deposit was 3%, the compression constraints were $2.5 \cdot 10^4$ $N/cm^2$. Chemical etching of said oxide with a 10% hydrofluoric acid solution buffered by ammonium fluoride in deionized water was 6 times faster than that of a reference thermal oxide and the deposit density was 2.3 $g/cm^2$.

The aforementioned apparatus according to the invention can obviously be used for the chemical cleaning of substrates or for anisotropically or isotropically etching them.

We claim:

1. Diffusion plasma-assisted chemical treatment apparatus incorporating a tight treatment enclosure (12) having an axis of symmetry (18), axial production means (20, 22) for a plasma of a carrier gas in the enclosure, at least one continuous solid plate (30) serving as an obstacle to the plasma and positioned perpendicular to the axis (18) and downstream of the production means, plasma diffusion means (40) located downstream of the plate (30) in the enclosure, several non-ionized vector gas supply tubes (50) issuing axially into the enclosure, beneath the diffusion means (40), the ends (52) of said tubes issuing into the enclosure being in the same plane around the enclosure axis and being arranged to provide a delocalized distribution of vector gas, at least one substrate carrier (56) located in the enclosure downstream of the supply tubes and perpendicular to the enclosure axis and annular, axial pumping means (16, 64, 66) for the gaseous medium contained in the enclosure and positioned downstream of the substrate carrier.

2. Apparatus according to claim 1, characterized in that it also comprises a perpheral buffer chamber (48) surrounding the axis (18) and linked with the supply tubes (50) and the vector gas supply means (38) for said buffer chamber.

3. Apparatus according to claim 2, characterized in that the buffer chamber (48) is toroidal.

4. Apparatus according to claim 1, characterized in that the tube ends (52) are arranged according to concentric circles centered on the enclosure axis.

5. Apparatus according to claim 1, characterized in that the tubes (50) are made from an electricity conducting material, their outer wall then being coated with an electrically insulating material (72) and then a conductive material (74).

6. Apparatus according to claim 5, characterized in that polarization means (68) for the tubes (50) or the conductive material (74) are provided.

7. Apparatus according to claim 1, characterized in that it also comprises a buffer chamber (32) sealed by a perforated plate (40) constituting the plasma diffusion means, said chamber (32) communicating with the plasma production means (20,22), the obstacle plate contained in said chamber defining with the latter a peripheral space (42) for the passage of the plasma.

8. Apparatus according to claim 1, characterized in that the plasma production means (20,22) comprise an axial carrier gas supply (20) coupled to carrier gas exciting means (22).

9. Apparatus according to claim 1, characterized in that the plasma production means comprise a surfaguide (22).

10. Apparatus according to claim 1, characterized in that substrate carrier heating and/or polarization means (59) are provided.

11. Apparatus according to claim 6, characterized in that the perforated plate (40) has dimensions greater than those of the substrate carrier (56) or the substrate carrier assembly.

12. Diffusion plasma-assisted chemical treatment apparatus incorporating a tight treatment enclosure (12) having an axis of symmetry (18), axial production means (20,22) for a plasma of a carrier gas in the enclosure, at least one continuous solid plate (30) serving as an obstacle to the plasma and positioned perpendicular to the axis (18) and downstream of the production means, plasma diffusion means (40) located downstream of the plate (30) in the enclosure, several non-ionized vector gas supply tubes (50) issuing axially into the enclosure, beneath the diffusion means (40), the ends (52) of said tubes issuing into the enclosure being in the same plane around the enclosure axis and being arranged in concentric circles centered on the enclosure axis, at least one substrate carrier (56) located in the enclosure downstream of the supply tubes and perpendicular to the enclosure axis and annular, axial pumping means (16, 64, 66) for the gaseous medium contained in the enclosure and positioned downstream of the substrate carrier.

* * * * *